US009059004B2

(12) United States Patent  (10) Patent No.: US 9,059,004 B2
Wang  (45) Date of Patent: Jun. 16, 2015

(54) METHOD FOR CHIP SCALE PACKAGE AND PACKAGE STRUCTURE THEREOF

(75) Inventor: TsingChow Wang, Shanghai (CN)

(73) Assignee: SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 13/179,837

(22) Filed: Jul. 11, 2011

(65) Prior Publication Data

US 2012/0153459 A1  Jun. 21, 2012

(30) Foreign Application Priority Data

Dec. 21, 2010  (CN) .......................... 2010 1 0599212

(51) Int. Cl.
    *H01L 23/48*    (2006.01)
    *H01L 23/00*    (2006.01)
    *H01L 23/31*    (2006.01)

(52) U.S. Cl.
CPC ............ *H01L 24/06* (2013.01); *H01L 23/3114* (2013.01); *H01L 24/03* (2013.01); *H01L 24/05* (2013.01); *H01L 24/11* (2013.01); *H01L 24/13* (2013.01); *H01L 24/14* (2013.01); *H01L 2224/0345* (2013.01); *H01L 2224/036* (2013.01); *H01L 2224/0361* (2013.01); *H01L 2224/0391* (2013.01); *H01L 2224/0401* (2013.01); *H01L 2224/05611* (2013.01); *H01L 2224/05616* (2013.01); *H01L 2224/05647* (2013.01); *H01L 2224/0603* (2013.01); *H01L 2224/1181* (2013.01); *H01L 2224/1403* (2013.01); *H01L 2924/01029* (2013.01); *H01L 2924/01047* (2013.01); *H01L 2924/01082* (2013.01); *H01L 2924/014* (2013.01); *H01L 2224/1308* (2013.01); *H01L 2224/1134* (2013.01); *H01L 2924/01033* (2013.01); *H01L 2924/0105* (2013.01)

(58) Field of Classification Search
CPC ....................................................... H01L 24/14
USPC ................................................. 257/737, 778
See application file for complete search history.

(56) References Cited

U.S. PATENT DOCUMENTS 5,186,383 A * 2/1993 Melton et al. ............ 228/180.22
5,811,351 A * 9/1998 Kawakita et al. ............. 438/613

(Continued)

FOREIGN PATENT DOCUMENTS

| CN | 1499544 A | 5/2004 |
| CN | 1848381 A | 10/2006 |
| JP | 2000208665 A | 7/2000 |

*Primary Examiner* — David Vu
*Assistant Examiner* — Brandon Fox
(74) *Attorney, Agent, or Firm* — Annova Law Group, PLLC

(57) ABSTRACT

This invention provides a method for chip scale package and a chip scale package structure. The chip scale package structure includes: a semiconductor substrate, on which sets a plurality of contact bonding pads being connected with semiconductor devices; and a plurality of bumps respectively attached to all of the contact bonding pads. The semiconductor substrate is divided into several regions according to different distances from a central point. The contact bonding pads and the bumps in the region which is closest to the central point are the smallest, while the contact bonding pads and the bumps in the region which is farthest to the central point are the largest. The invention effectively improves the situation that the bumps at the edge tend to flake off easily; in addition, it avoids short-circuit caused by bridging between the bumps.

17 Claims, 3 Drawing Sheets

(56) References Cited

U.S. PATENT DOCUMENTS

| | | | |
|---|---|---|---|
| 6,107,685 A * | 8/2000 | Nishiyama | 257/737 |
| 6,534,875 B1 * | 3/2003 | Nishiyama | 257/778 |
| 7,019,407 B2 * | 3/2006 | Chen et al. | 257/778 |
| 2001/0022315 A1 | 9/2001 | Tsai et al. | |
| 2011/0248398 A1 * | 10/2011 | Parvarandeh et al. | 257/737 |
| 2012/0103671 A1 * | 5/2012 | Lee et al. | 174/260 |

* cited by examiner

METHOD FOR CHIP SCALE PACKAGE AND PACKAGE STRUCTURE THEREOF

CROSS REFERENCE TO RELATED APPLICATIONS

The present application claims the priority of Chinese Patent Application No. 201010599212.8, entitled "Method for Chip Scale Package and Package Structure thereof", and filed on Dec. 21, 2010, the entire disclosure of which is incorporated herein by reference.

BACKGROUND OF THE INVENTION

1. Field of the Invention

The present invention is generally related to the manufacturing field of semiconductor devices, and particularly to a method for Chip Scale Package (CSP) and a package structure thereof.

2. Description of Prior Art

With the continuous development in integrated circuit technology, electronic products are increasingly developing in a direction of miniaturization, intellectualization, high-performance and high-reliability. Integrated circuit (IC) package not only has direct influence on the performance of integrated circuit, electronic module and even the whole machine, but also restricts the miniaturization of the whole electronic system, the low-cost and reliability. Due to the narrowing size of integrated circuit wafers and the improving level of integration, electronic industry has made higher and higher requirements on IC package technology.

Under these circumstances, electronic industry has made higher and higher requirements on IC package technology. Therefore, integrated circuit fabrication is miniaturized, which causes a rise in logic circuits contained in the chips, and increases the number of chip input/output (I/O) pin. To meet the demands, many different methods for package come into being, such as Ball Grid Array (BGA), Chip Scale Package (CSP), Multi Chip Module package (MCM package), Flip Chip Package, Tape Carrier Package (TCP), Wafer Level Package (WLP), etc.

No matter which one is used, most of the methods for package tend to accomplish the package process after detaching wafer into separate chips, which is Chip Scale Package (CSP). CSP forms a connection between an overturned chip and a base plate through a solder ball which formed on the surface of the chip, and thus reduces the package size, meets the needs of high-performance (such as high speed, high frequency and smaller pins) and small outline of electronic products and makes the products have excellent electronic and heat-transfer properties.

Bump formation technology is a key technology in CSP. Usually the breakdown of CSP is caused by the failure of bumps, so the reliability of the bumps is the main problem to be solved in the development of CSP technology. In the prior art, solder deposits on a piece of chip metal bedding through some certain technological processes. Bumps are the metal solder balls formed after reflowing under certain temperature.

With the increasing integration of semiconductor devices, distances between bumps decrease rapidly. Bumps at the edge are liable to peel off because the edges of the chip are far from the central point, and in conditions of periodic variation of temperature, the stress on the bumps at the edge is greater than that closer to the central point. In order to maintain the mechanical intensity of a bump, volume of the bump needs to be enlarged. However, due to the mutual soluble physical property of metals, increasing volume of all bumps in limited area will make the bumps become larger and turn to a lateral move. This may cause bridging between bumps, then leads to further short-circuit, and finally influence the electrical property of semiconductor devices.

SUMMARY OF THE INVENTION

Embodiments of the present invention provide a method for CSP and a package structure thereof, for preventing peeling-off of bumps and bridging between bumps.

One embodiment of the present invention provides a CSP structure, comprising: a semiconductor substrate having a plurality of contact bonding pads formed thereon, the contact bonding pads electrically connected with semiconductor devices; and a plurality of bumps respectively attached to all of the contact bonding pads. The semiconductor substrate is divided into several regions according to different distances from a central point, the contact bonding pads and bumps in a region which is closest to the central point are the smallest, while the contact bonding pads and bumps in a region which is farthest to the central point are the largest.

One embodiment of the present invention provides a method for CSP, comprising: providing a semiconductor substrate having semiconductor devices formed thereon, and the semiconductor substrate being divided into several regions according to the different distances from a central point; forming a plurality of contact bonding pads which are electrically connected with the semiconductor devices on the semiconductor substrate, the contact bonding pads having intervals and critical dimensions of the contact bonding pads in a region which is closest to the central point being the smallest, while critical dimensions of the contact bonding pads in a region which is farthest to the central point being the largest; and forming bumps on the contact bonding pads, dimensions of the bumps in the region which is closest to the central point being the smallest, while dimensions of the bumps in the region which is farthest to the central point being the largest.

Compared with prior art, the present invention has the following advantages. The chip is divided into several regions according to different distances from the central point on the semiconductor substrate. The critical dimensions of the contact bonding pads and the diameters of the bumps, which are closest to the central point, are the smallest. The farther the contact bonding pads and the bumps are from the central point, the larger the critical dimensions of the contact bonding pads and the diameters of the bumps are. The diameters of the bumps at the edge of the chip turn to be the largest, which enhance the adhesion between the bumps and the contact bonding pads at the edge, and effectively improves the situation that the bumps at the edge are liable to peel off. In addition, the devices in the central region of the semiconductor substrate are comparatively centralized, and the diameters of the bumps are the smallest. Thus short-circuit caused by bridging between bumps will not happen. At the edge, amounts of the bumps will be appropriately reduced because the devices are comparatively thin, and bridging will not happen if the diameters of the bumps are increased.

DETAILED DESCRIPTION OF THE EMBODIMENTS

As one of IC packaging technology, CSP technology brings higher level of integration and better performance to semiconductor devices. CSP technology forms a plurality of solder bumps on a surface of a semiconductor substrate and connects a chip with a lead frame, thereby reducing the package size, meeting the needs of high-performance of electronic products (such as high speed, high frequency and smaller pins) and making the products have excellent electronic and heat-transfer properties.

However, the inventor found out that with the increasing integration of the semiconductor devices, distances between the bumps decrease rapidly. The bumps at the edge are liable to peel off because the edge of the chip is far from the central point, and in conditions of periodic variation of temperature, the stress on the bumps at the edge is greater than that closer to the central point. In order to maintain the mechanical intensity of a bump, volume of the bump needs to be enlarged. However, due to the mutual soluble physical property of metals, increasing volume of all bumps in limited area will make the bumps become larger and turn to a lateral move. This may causes bridging between the bumps, then leads to further short-circuit, and finally influences the electrical property of semiconductor devices.

Considering the technical problems, based on the experiments, the inventor divided the chip into several regions according to different distances from the central point on the semiconductor substrate. The diameters of the bumps which are closest to the central point are the smallest. And the farther the bumps are from the central point, the larger the diameters of the bumps are. The diameters of the bumps at the edge of the chip are the largest, which enhance the adhesion between the bumps and the contact bonding pads at the edge, and effectively improves the situation that the bumps at the edge are liable to peel off. In addition, the devices in the central region of the semiconductor substrate are comparatively centralized, and the diameters of the bumps are the smallest. Thus short-circuit caused by bridging between bumps will not happen. At the edge, amounts of the bumps will be appropriately reduced because the devices are comparatively thin, and bridging will not happen if the diameters of the bumps are increased.

Figure 1:
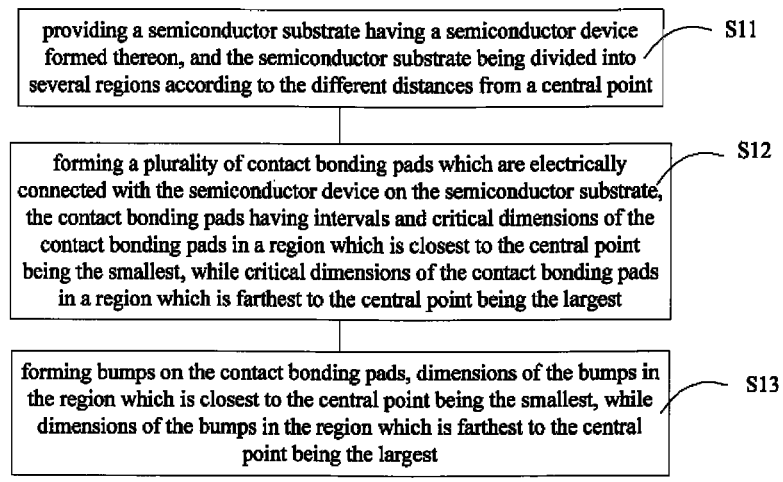
FIG. 1 shows a schematic flow chart of forming a CSP structure according to an embodiment of the present invention.

A method for forming a CSP structure according to an embodiment of the present invention is shown in FIG. 1. The method includes the following steps.

Step S11: providing a semiconductor substrate, wherein the semiconductor substrate has semiconductor devices formed thereon and is divided into several regions according to different distances from a central point.

In the embodiment, semiconductor devices are formed on a surface of the semiconductor substrate.

Figure 2:
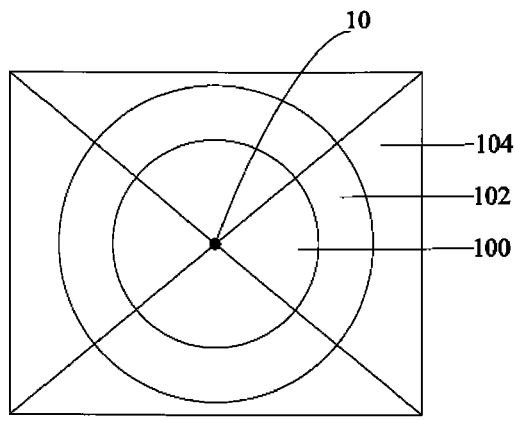
FIG. 2 shows a schematic diagram of the regional division on a chip.

As a first embodiment which is shown in FIG. 2, division of regions is performed firstly according to distances from the central point. When a chip size is 8 mm, taking a central point 10 as a center with a radius ranging from 0 mm to 4 mm, taking this circle as a first region 100, density of the semiconductor devices in the first region 100 is the highest. Taking the central point 10 as the center with a radius ranging from 4 mm to 6 mm, taking this annulus as a second region 102, density of the semiconductor devices in the second region 102 is thinner than density in the first region 100. Taking the region that from edge of the second region 102 to the edge of the substrate as a third region 104, in the third region 104, distance from the central point 10 is ranging from 6 mm to 8 mm, and since it is the edge, density of the semiconductor devices is the lowest.

In a second embodiment, when a chip size is 16 mm, taking a central point 10 as the center with a radius ranging from 0 mm to 8 mm, taking this circle as a first region 100, density of the semiconductor devices is the highest. Taking the central point 10 as the center with a radius ranging from 8 mm to 12 mm, taking this annulus as a second region 102, density of the semiconductor devices in the second region 102 is thinner than density in the first region 100. Taking the region that from edge of the second region 102 to the edge of the substrate as a third region 104, density of the semiconductor devices is thinner in the third region 104 than density in the second region 102, and since it is the edge, density of the semiconductor devices is the lowest.

In addition to the above two embodiments, the division of the chip region mainly depends on density of the semiconductor devices and the chip area.

Step S12: forming a plurality of contact bonding pads which are electrically connected with the semiconductor devices on the semiconductor substrate, the contact bonding pads having intervals and critical dimensions of the contact bonding pads in a region which is closest to the central point being the smallest, while critical dimensions of the contact bonding pads in a region which is farthest to the central point being the largest.

In the first embodiment as FIG. 2 shows, since the density of the semiconductor devices in the first region 100 is the highest, accordingly the critical dimensions of the bonding pads are the smallest, ranging from about 90 μm to 100 μm, preferably about 96 μm. The density of the semiconductor devices in the second region 102 is thinner than density of the semiconductor devices in the first region 100, so that the critical dimensions of the contact bonding pads in the second region 102 are accordingly increased, ranging from about 110 μm to 115 μm, preferably about 112 μm. In the third region 104 which is the edge area, density of the semiconductor devices is the lowest, and due to the edge effect, bumps are likely to peel off, so that the critical dimensions of the contact bonding pads in the third region 104 are increased largely enough, and meanwhile bridging will be avoided. The critical dimensions of the contact bonding pads in the third region 104 are ranging from about 125 μm to 130 μm, preferably about 128 μm.

In the second embodiment as FIG. 2 shows, when chip size reaches to 16 mm, density of the semiconductor devices in the first region 100 is the highest, and accordingly the critical dimensions of the contact bonding pads are ranging from about 140 μm to 150 μm, preferably about 144 μm; while the density of the semiconductor devices in the annular second region 102 which is out of the first region 100 are thinner than density of the semiconductor devices in the first region 100, so that the critical dimensions of the contact bonding pads in the second region 102 are accordingly increased, ranging from about 160 μm to 170 μm, preferably about 168 μm; in the annular third region 104 which is out of the second region 102, density of the semiconductor devices is the lowest, and due to the edge effect, bumps are likely to peel off, so that the critical dimensions of the contact bonding pads in the third region 104 are increased largely enough, and meanwhile bridging will be avoided. The critical dimensions of the contact bonding pads in the third region 104 are ranging from about 190 μm to 195 μm, preferably about 192 μm.

Step S13: forming bumps on the contact bonding pads, the size of the bumps in a region which is closest to the central point being the smallest, while the size of the bumps in a region which is farthest to the central point being the largest.

In a third embodiment, as FIG. 2 shows, when a chip size is 8 mm, taking a central point 10 of the chip as a center, according to different densities of semiconductor devices moving toward the edge, the chip is divided into a first region 100, a second region 102 and a third region 104. The sizes of the contact bonding pads are changed, so are the sizes of the bumps on the contact bonding pads. The heights of the bumps in each region are consistent, ranging from about 92 μm to 108 μm, preferably about 100 μm. However, the diameters of the bumps are quite different. The diameters of the bumps formed on the contact bonding pads in the first region 100 are ranging from about 120 μm to 125 μm, preferably about 123 μm; the diameters of the bumps formed on the contact bonding pads in the second region 102 are ranging from about 128 μm to 135 μm, preferably about 131 μm; and the diameters of the bumps formed on the contact bonding pads in the third region 104 are ranging from about 138 μm to 145 μm, preferably about 141 μm.

In a fourth embodiment, as FIG. 2 shows, when a chip size is 16 mm, taking a central point 10 of the chip as a center, according to different densities of semiconductor devices moving toward the edge, the chip is divided into a first region 100, a second region 102 and a third region 104. The sizes of the contact bonding pads are changed, so are the sizes of the bumps on the contact bonding pads. The heights of the bumps in each region are consistent, ranging from about 140 μm to 160 μm, preferably about 150 μm. However, the diameters of the bumps are quite different. The diameters of the bumps formed in the first region 100 are ranging from about 180 μm to 190 μm, preferably about 185 μm; the diameters of the bumps formed in the second region 102 are ranging from about 195 μm to 200 μm, preferably about 197 μm; and the diameters of the bumps formed in the third region 104 are ranging from about 205 μm to 215 μm, preferably about 211 μm.

The CSP structure formed according to the above embodiments includes a semiconductor substrate, on which sets a plurality of contact bonding pads which are electrically connected with semiconductor devices; and a plurality of bumps respectively attached to each of the contact bonding pads; wherein the semiconductor substrate is divided into several regions according to different distances from a central point. The contact bonding pads and bumps in a region which is closest to the central point are the smallest, while the contact bonding pads and bumps in a region which is farthest to the central point are the largest.

Hereunder, the present invention will be described in detail with reference to embodiments, in conjunction with the accompanying drawings.

Figure 3:
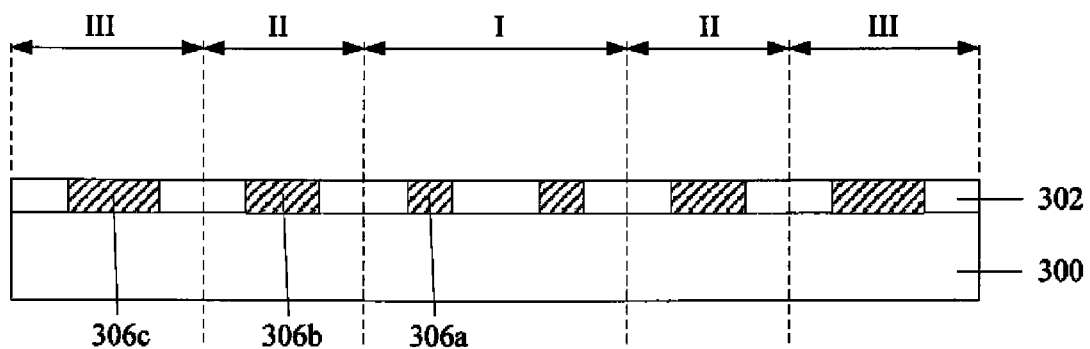
FIG. 3 and FIG. 4 show schematic diagrams of performing CSP according to a first embodiment of the present invention.
Figure 4:
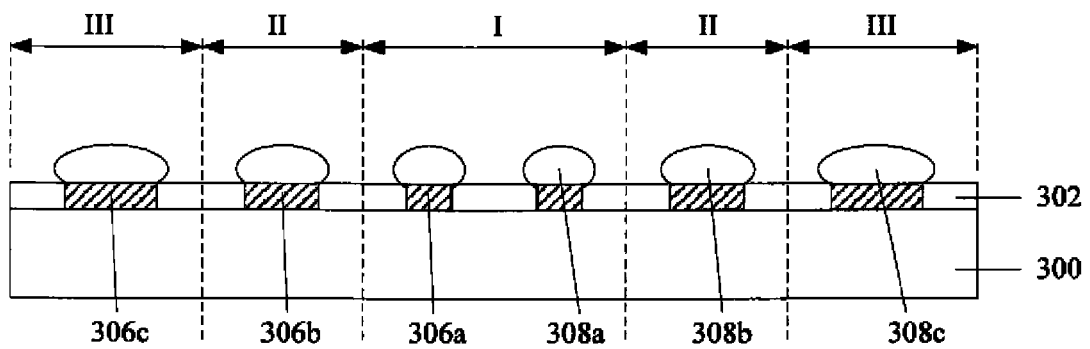

FIG. 3 and FIG. 4 show schematic diagrams of performing CSP according to a fifth embodiment of the present invention. As FIG. 3 shows, a chip is provided. A semiconductor substrate 300 of the chip has semiconductor devices thereon; however, to simplify the schematic diagram, a blank semiconductor substrate is shown in the figures. Taking a central point of the semiconductor substrate 300 as the center, according to different dimensions and densities of the semiconductor substrate 300 moving toward the edge, the semiconductor substrate 300 is divided into a first region I, a second region II and a third region III. Contact bonding pads 306*a*, 306*b* and 306*c* and the passivation layer 302 are formed on the semiconductor substrate 300. The contact bonding pads 306*a*, 306*b* and 306*c* are separated by the passivation layer 302.

The specific processes of forming the contact bonding pads 306*a*, 306*b* and 306*c* and the passivation layer 302 are as follows. First, a metal layer is formed on the semiconductor substrate 300, and the metal layer may be made of Cu, Sn, Pb, copper alloy, or tin-lead alloy. The metal layer has a thickness ranging from about 18 μm to 35 μm. The metal layer may be prepared by Physical Vapor Deposition (PVD) method, patterned by the existing lithography technology and etched by etching technology, and finally the contact bonding pads 306*a*, 306*b* and 306*c* are formed. The critical dimensions of the contact bonding pads 306*a* in the first region I are the smallest. The critical dimensions of the contact bonding pads 306*b* in the second region II are larger than critical dimensions of the contact bonding pads 306*a* in the first region I. And the critical dimensions of the contact bonding pads 306*c* in the third region III are the largest.

After that, a passivation layer 302 is formed on the semiconductor substrate 300 and the contact bonding pads 306*a*, 306*b* and 306*c*. The passivation layer 302 may be made of silicon oxide, silicon nitride, nitrogen oxides, benzocyclobutene, or PTFE. Then the passivation layer 302 is planarized by chemical mechanical polishing method until surfaces of the contact bonding pads 306*a*, 306*b* and 306*c* are exposed. The area of the contact bonding pads 306*a* is the smallest, the area of the contact bonding pads 306*b* is larger than area of the contact bonding pads 306*a*, and the area of the contact bonding pads 306*c* is the largest.

As FIG. 4 shows, a plurality of bumps 308*a*, 308*b* and 308*c* are respectively formed on the contact bonding pads 306*a*, 306*b* and 306*c*. The diameter of the bumps 308*a* in the first region I is the smallest, the diameter of the bumps 308*b* in the second region II is larger than diameter of the bumps 308*a* in the first region I, and the diameter of the bumps 308*c* in the third region III is the largest.

In the embodiment, the bumps 308*a*, 308*b* and 308*c* may be made of codissolved tin-lead alloy, high lead tin-lead alloy, Sn—Ag alloy or Sn—Ag—Cu alloy.

Methods for forming the bumps 308*a*, 308*b* and 308*c* may be wire bonding or screen printing. If the bumps are formed by wire bonding, in order to form bumps in different dimensions, a stannous metal wire is made on the contact bonding pads 306*a* in the first region I; two stannous metal wires is made on the contact bonding pads 306*b* in the second region II; three stannous metal wires is made on the contact bonding pads 306*c* in the third region III. The exact number depends on thickness of the stannous metal wires, dimension of the follow-on formed bumps and distances between bumps. Take a stannous metal wire with a diameter of 30 μm for example. The diameter of the stannous metal wire formed by wire bonding is about 60 μm to 75 μm, and height of the stannous metal wire is about 50 μm to 60 μm. The superposition of two stannous metal wires makes the volume double; and the superposition of three stannous metal wires makes the volume triple.

Then, flux is coated on the stannous metal wires and the semiconductor substrate 300 is put into a reflow oven, for making the stannous metal wires on the semiconductor substrate 300 under heat insulation and reflow, thus forming the bumps 308*a*, 308*b* and 308*c*, which are of same heights but different diameters. The diameter of the bump 308*a* is the smallest, the diameter of the bump 308*b* is larger than diameter of the bump 308*a*, and the diameter of the bump 308*c* is the largest.

According to the above embodiments, the CSP structure includes: a semiconductor substrate 300, on which semiconductor devices are formed. Taking a central point of the semiconductor substrate 300 as a center, according to different dimensions and densities of the devices moving toward the edge, the semiconductor substrate 300 is divided into a first region I, a second region II and a third region III. The passivation layer 302 is on the semiconductor substrate 300. A plurality of contact bonding pads 306a, 306b and 306c, are also on the semiconductor substrate 300, taking the passivation layer 302 as interval between a pair of the contact bonding pads, and are flush with the surface of the passivation layer 302. The contact bonding pads 306a, 306b and 306e are electrically connected with the semiconductor devices. The contact bonding pads 306a locate in the first region I, and their area is the smallest; the contact bonding pads 306b are in the second region II, and their area is larger than area of the contact bonding pads 306a in the first region I; the contact bonding pads 306c is in the third region III, and their area is the largest. A plurality of bumps 308a, 308b and 308c are respectively attached to each of the contact bonding pads 306a, 306b and 306c. The diameter of the bumps 308a on the contact bonding pads 306a is the smallest, the diameter of the bumps 308c on the contact bonding pads 306c is the largest, and the diameter of the bumps 308b on the contact bonding pads 306b is in the middle.

Figure 5:
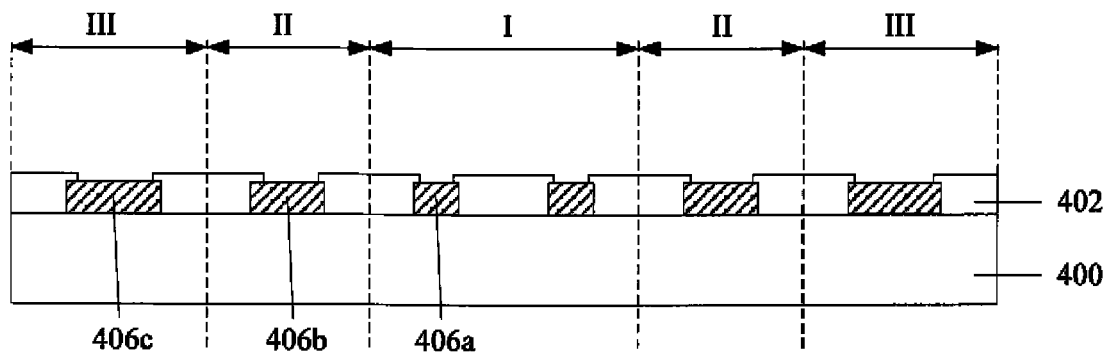
FIG. 5 and FIG. 6 show schematic diagrams of performing CSP according to a second embodiment of the present invention.
Figure 6:
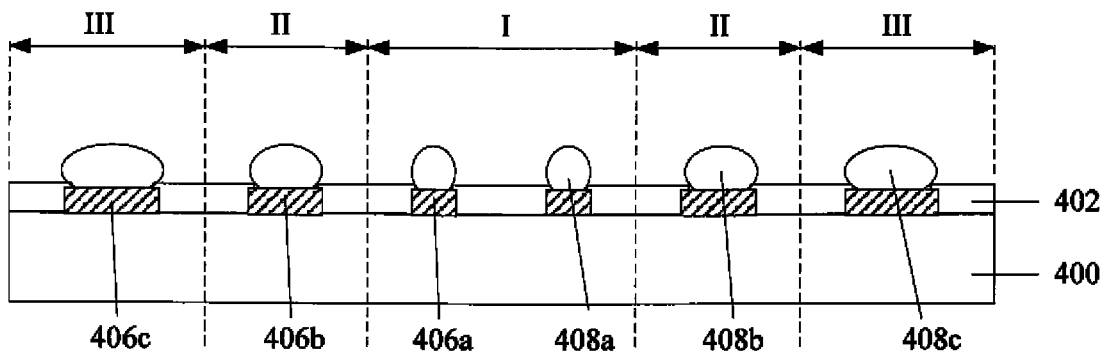

FIG. 5 and FIG. 6 show schematic diagrams of performing CSP according to a sixth embodiment of the present invention. As FIG. 6 shows, a semiconductor substrate 400 is provided, on which semiconductor devices are formed. Taking a central point of the semiconductor substrate 400 as a center, according to different dimensions and densities of the devices moving toward the edge, the semiconductor substrate 400 is divided into a first region I, a second region II and a third region III. A plurality of contact bonding pads 406a, 406b and 406c and the passivation layer 402 are formed on the semiconductor substrate 400, and the contact bonding pads 406a, 406b and 406c are tessellated in the passivation layer 402. The passivation layer 402 has an opening, and the contact bonding pads 406a, 406b and 406c are exposed by the opening of the dielectric layer 402.

The technology that forming the passivation layer 402 and the contact bonding pads 406a, 406b and 406c is well known in this field. As an embodiment of the present invention, a metal layer which may be made of Cu, Sn, Pb, copper alloy, or tin-lead alloy is formed firstly on the semiconductor substrate 400. The metal layer may be prepared by Physical Vapor Deposition (PVD) method. Then the metal layer is patterned and etched by existing lithography and etching technology for forming the contact bonding pads 406a, 406b and 406c.

After that, the passivation layer 402 is formed on the semiconductor substrate 400 and the contact bonding pads 406a, 406b and 406c. The passivation layer 402 may be made of some high polymers such as silicon oxide, silicon nitride, nitrogen oxides, benzocyclobutene, or PTFE. Then an opening is formed on the passivation layer 402 by using existing lithography and etching technology, and the contact bonding pads 406a, 406b and 406c are exposed by the opening. The area of the contact bonding pad 406a is the smallest, the area of the contact bonding pad 406b is larger than area of the contact bonding pad 406a, and the area of the contact bonding pad 406c is the largest.

As FIG. 6 shows, the bumps 408a, 408b and 408c are respectively formed on each of the contact bonding pads 406a, 406b and 406c. The diameter of the bumps 408a in the first region I is the smallest, the diameter of the bumps 408b in the second region II is larger than diameter of the bumps 408a in the first region I, and the diameter of the bumps 408c in the third region III is the largest.

The method for forming the bumps 408a, 408b and 408c is the same as that in the fourth embodiment, and will not described again.

In the embodiment, the bumps 408a, 408b and 408c may be made of codissolved tin-lead alloy, high lead tin-lead alloy, Sn—Ag alloy or Sn—Ag—Cu alloy.

According to the above embodiments, the CSP structure includes: a semiconductor substrate 400, on which semiconductor devices are formed. Taking a central point of the semiconductor substrate 400 as a center, according to different dimensions and densities of the devices moving toward the edge, the semiconductor substrate 400 is divided into a first region I, a second region II and a third region III. A passivation layer 402 is formed on a second surface of the semiconductor substrate 400. A plurality of contact bonding pads 406a, 406b and 406c are tessellated in the passivation layer 402. There is an opening on the passivation layer 402, and the contact bonding pads 406a, 406b and 406c are exposed through the dielectric layer 402. The contact bonding pads 406a, 406b and 406c are electrically connected with the plugs in the semiconductor substrate 400. The contact bonding pads 406a locate in the first region I, and their area is the smallest; the contact bonding pads 406b are in the second region II, and their area is larger than area of the contact bonding pads 406a in the first region I; the contact bonding pads 406c are in the third region III, and their area is the largest. A plurality of bumps 408a, 408b and 408c are respectively attached to each of the contact bonding pads 406a, 406b and 406c. The diameter of the bumps 408a on the contact bonding pad 406a is the smallest, the diameter of the bumps 408c on the contact bonding pads 406c is the largest, and the diameter of the bumps 408b on the contact bonding pads 406b is in the middle.

Although the present invention has been disclosed as above with reference to preferred embodiments thereof but will not be limited thereto. Those skilled in the art can modify and vary the embodiments without departing from the spirit and scope of the present invention. Accordingly, without departing from the scope of the present invented technology scheme, whatever simple modification and equivalent variation belong to the protection range of the present invented technology scheme.

What is claimed is:

1. A Chip Scale Package (CSP) structure, comprising:
 a semiconductor substrate having a plurality of contact bonding pads formed thereon, the contact bonding pads electrically connected with semiconductor devices; and
 a plurality of bumps respectively attached to each of the contact bonding pads,
 wherein the semiconductor substrate is divided into several regions comprising a first region, a second region, and a third region according to different distances from a central point, and wherein the central point makes the first region, and the second region is between the first region and the third region, and
 wherein a contact bonding pad and a bump in the first region are positioned directly on top of the central point and are the smallest, while the contact bonding pads and a bumps in the third region which is farthest to the central point are the largest, and sizes of the contact bonding pads and bumps in the several regions are determined based on a likeliness of peeling-off and bridging of the bumps such that the bumps in the several regions are less likely to peel-off and to bridge with neighboring bumps.

2. The CSP structure according to claim 1, wherein the bumps in each region have substantially the same heights, while the farther a region is from the central point, the larger diameter of the bumps in the region is.

3. The CSP structure according to claim 2, wherein the bumps may be made of codissolved tin-lead alloy, high lead tin-lead alloy, Sn-Ag alloy or Sn-Ag-Cu alloy.

4. The CSP structure according to claim 1, wherein when a size of the chip is 8 mm, a region distanced from the central point ranging from 4 mm to 6 mm is the second region, a region distanced from the central point ranging from 6 mm to 8 mm is the third region.

5. The CSP structure according to claim 1, wherein the bumps have heights ranging from about 92 μm to 108 μm.

6. The CSP structure according to claim 5, wherein
in the first region, critical dimensions of the contact bonding pads range from about 90 μm to 100 μm, and diameters of the bumps range from about 120 μm to 125 μm;
in the second region, critical dimensions of the contact bonding pads range from about 110 μm to 115 μm, and diameters of the bumps range from about 128 μm to 135 μm;
in the third region, critical dimensions of the contact bonding pads range from about 125 μm to 130 μm, and diameters of the bumps range from about 138 μm to 145 μm.

7. The CSP structure according to claim 1, wherein when a size of the chip is 16 mm, a region distanced from the central point ranging from 8 mm to 12 mm is the second region; and a region distanced from the central point ranging from 12 mm to 16 mm is the third region.

8. The CSP structure according to claim 1, wherein the bumps have heights ranging from about 140 μm to 160 μm.

9. The CSP structure according to claim 8, wherein
in the first region, critical dimensions of the contact bonding pads range from about 140 μm to 150 μm, and diameters of the bumps range from about 180 μm to 190 μm;
in the second region, critical dimensions of the contact bonding pads range from about 160 μm to 170 μm, and diameters of the bumps range from about 195 μm to 200 μm; and
in the third region, critical dimensions of the contact bonding pads range from about 190 μm to 195 μm, and diameters of the bumps range from about 205 μm to 215 μm.

10. The CSP structure according to claim 1, wherein the contact bonding pads are separated by a passivation layer.

11. The CSP structure according to claim 10, wherein the contact bonding pads may be made of Cu, Sn, Pb, copper alloy, or tin-lead alloy.

12. The CSP structure according to claim 10, the passivation layer is made of silicon oxide, silicon nitride, nitrogen oxides, benzocyclobutene, or PTFE.

13. A method for forming a CSP structure stated in claim 1, comprising:
providing a semiconductor substrate having semiconductor devices formed thereon, and the semiconductor substrate being divided into several regions according to the different distances from a central point;
forming a plurality of contact bonding pads which are electrically connected with the semiconductor devices on the semiconductor substrate, the contact bonding pads having intervals and critical dimensions of the contact bonding pads in a region which is closest to the central point being the smallest, while critical dimensions of the contact bonding pads in a region which is farthest to the central point being the largest; and
forming bumps on the contact bonding pads, dimensions of the bumps in the region which is closest to the central point being the smallest, while dimensions of the bumps in the region which is farthest to the central point being the largest, and the dimensions of the bumps in the several regions are determined based on a likeliness of peeling-off and bridging of the bumps such that the bumps in the several regions are less likely to peel-off and to bridge with neighboring bumps.

14. The method for forming the CSP structure according to claim 13, wherein the bumps are formed by wire bonding or screen printing.

15. The method for forming the CSP structure according to claim 13, wherein the bonding pads are separated by a passivation layer.

16. The CSP structure according to claim 1, wherein the contact bonding pads and bumps in the second region are positioned and lined up according to a first circle centered by the central point.

17. The CSP structure according to claim 1, wherein the contact bonding pads and bumps in the third region are positioned and lined up according to a second circle centered by the central point.

* * * * *